US011802741B2

United States Patent
Xiao

(10) Patent No.: US 11,802,741 B2
(45) Date of Patent: Oct. 31, 2023

(54) FLUID COOLING DEVICE

(71) Applicant: ShenZhen Apaltek Co., Ltd., ShenZhen (CN)

(72) Inventor: Qineng Xiao, Guangdong (CN)

(73) Assignee: SHENZHEN APALTEK CO., LTD., Shenzhen (CN)

( * ) Notice: Subject to any disclaimer, the term of this patent is extended or adjusted under 35 U.S.C. 154(b) by 374 days.

(21) Appl. No.: 16/470,558

(22) PCT Filed: Feb. 27, 2019

(86) PCT No.: PCT/CN2019/076226
§ 371 (c)(1),
(2) Date: Mar. 16, 2021

(87) PCT Pub. No.: WO2020/155265
PCT Pub. Date: Aug. 6, 2020

(65) Prior Publication Data
US 2021/0199391 A1    Jul. 1, 2021

(30) Foreign Application Priority Data

Jan. 31, 2019    (CN) .......................... 201910096769.0

(51) Int. Cl.
*F28F 3/12*        (2006.01)
*F04D 29/58*    (2006.01)

(52) U.S. Cl.
CPC ............ *F28F 3/12* (2013.01); *F04D 29/5866* (2013.01); *F28F 2250/08* (2013.01)

(58) Field of Classification Search
CPC .......... F28F 3/12; F28F 2250/08; F28F 9/268; F28F 9/18; F04D 29/5866; F04D 13/06; F04D 29/606; B33Y 80/00; H05K 7/20254
See application file for complete search history.

(56) References Cited

U.S. PATENT DOCUMENTS 6,894,899 B2 *    5/2005    Wu ..................... F28D 15/0266
257/E23.098
9,907,207 B1 *    2/2018    Wu ..................... H05K 7/20272
(Continued)

FOREIGN PATENT DOCUMENTS

CN         200966200 Y        10/2007
TW         M324810 U          1/2008
(Continued)

OTHER PUBLICATIONS

Office Action dated Jul. 19, 2019 of the corresponding Taiwan patent application No. 108107093.

*Primary Examiner* — Tho V Duong
(74) *Attorney, Agent, or Firm* — Chun-Ming Shih; HDLS IPR SERVICES

(57) ABSTRACT

A fluid cooling device includes an endothermic cover, an endothermic base and a fluid pump. The endothermic cover has a port; and a heat exchange chamber formed between the longitudinally affixed endothermic base and endothermic cover, and a heat exchange unit installed in the heat exchange chamber. The fluid pump includes a pump housing and a driving element, and the pump housing has a pump space and a coupling tube communicating to each other. A vane of a driving element is received in the pump space, and the coupling tube is longitudinally plugged into the port and seamlessly combined and fixed to each other, and the pump housing maintains an insulation gap with the endothermic cover through the coupling tube. Therefore, the heat of the heat sink will not be conducted to the fluid pump and no seam is produced and thus no waterproof gasket is needed.

10 Claims, 12 Drawing Sheets

(56) References Cited

U.S. PATENT DOCUMENTS

| | | | |
|---|---|---|---|
| 2005/0069432 A1* | 3/2005 | Tomioka | H01L 23/473 |
| | | | 257/E23.098 |
| 2005/0103475 A1* | 5/2005 | Lee | F28F 3/12 |
| | | | 257/E23.098 |
| 2005/0183848 A1* | 8/2005 | Cheng | F28F 3/12 |
| | | | 257/E23.098 |
| 2006/0171801 A1* | 8/2006 | Manabe | H01L 23/473 |
| | | | 415/176 |
| 2006/0185830 A1* | 8/2006 | Duan | H01L 23/473 |
| | | | 257/E23.098 |
| 2006/0279930 A1* | 12/2006 | Hata | G06F 1/203 |
| | | | 361/698 |
| 2007/0029069 A1* | 2/2007 | Duan | G06F 1/20 |
| | | | 257/E23.098 |
| 2018/0139865 A1 | 5/2018 | Draht et al. | |

FOREIGN PATENT DOCUMENTS

| | | |
|---|---|---|
| TW | M530421 U | 10/2016 |
| TW | M535934 U | 1/2017 |

* cited by examiner

FLUID COOLING DEVICE

BACKGROUND OF THE INVENTION

1. Technical Field

The technical field relates to fluid cooling, and more particularly to a seamless-connection type fluid cooling device.

2. Description of Related Art

A fluid such as water is usually used for conducting heat of a fluid cooling device, and the fluid cooling device generally comprises an endothermic structure and a fluid pump for pumping a fluid to flow and loop in the endothermic structure. The endothermic structure has a single chamber formed therein, and the fluid flows in the single chamber.

Since the heat absorbed by the endothermic structure is conducted to the fluid pump, therefore the fluid pump is always situated at a high-temperature working environment, and all electronic components in the fluid pump working in the high-temperature environment for a long time not just affect the functions of the electronic components only, but also damage the electronic components and lead to a failure of the electronic components.

In a conventional fluid cooling device, the fluid pump and the endothermic structure are partially coupled to each other to isolate most heat of the endothermic structure.

However, the conventional partially coupled structure between the fluid pump and the endothermic structure creates a gap that may cause a leakage of the fluid. Therefore, it is necessary to add a waterproof gasket to the conventional partially coupled structure. The waterproof gasket may be deteriorated easily after a certain time of use. Once if the waterproof gasket is deteriorated, the fluid will leak from the partially coupled structure easily.

In view of the aforementioned drawbacks of the prior art, the discloser of this disclosure based on years of experience in the related industry to conduct extensive research and experiment, and finally provided a feasible solution as disclosed in this disclosure to overcome the drawbacks of the prior art.

SUMMARY OF THE INVENTION

Therefore, it is a primary object of this disclosure to provide a fluid cooling device to overcome the drawbacks of the prior art such as the issues of conducting the heat of the heat sink and affecting the operation of the fluid pump, and to prevent fluid from leaking out from the partially coupled structure without requiring any waterproof gasket.

To achieve the aforementioned and other objectives, this disclosure discloses an embodiment of a fluid cooling device, comprising: an endothermic cover, having a port formed thereon; an endothermic base, having a heat exchange chamber and a heat exchange unit installed in the heat exchange chamber, and the heat exchange chamber being defined between the endothermic cover and the endothermic base, and the endothermic base and the endothermic cover being longitudinally attached to each other, and the port being longitudinally formed on the endothermic cover; and a fluid pump, including a pump housing and a driving element installed in the pump housing, and the pump housing having a pump space defined therein, and the driving element having a vane received in the pump space, and the pump housing having a coupling tube protruding towards the outside and communicating with the pump space, and the coupling tube being longitudinally plugged into the port and seamlessly combined and fixed to the coupling tube, and the pump housing maintaining an insulation gap with the endothermic cover through the coupling tube.

Compared with the prior art, this disclosure has the following effects: The insulation gap is provided to prevent the heat of the heat sink from being conducted to the fluid pump, and the seamless combination makes that there is no seam at the connecting position or the combining position (which is the inserting positon or the attaching position), so that the easily deteriorated waterproof gaskets are longer required.

DESCRIPTION OF THE PREFERRED EMBODIMENTS

The technical contents of this disclosure will become apparent with the detailed description of preferred embodiments accompanied with the illustration of related drawings as follows. It is intended that the embodiments and drawings disclosed herein are to be considered illustrative rather than restrictive.

Figure 8:
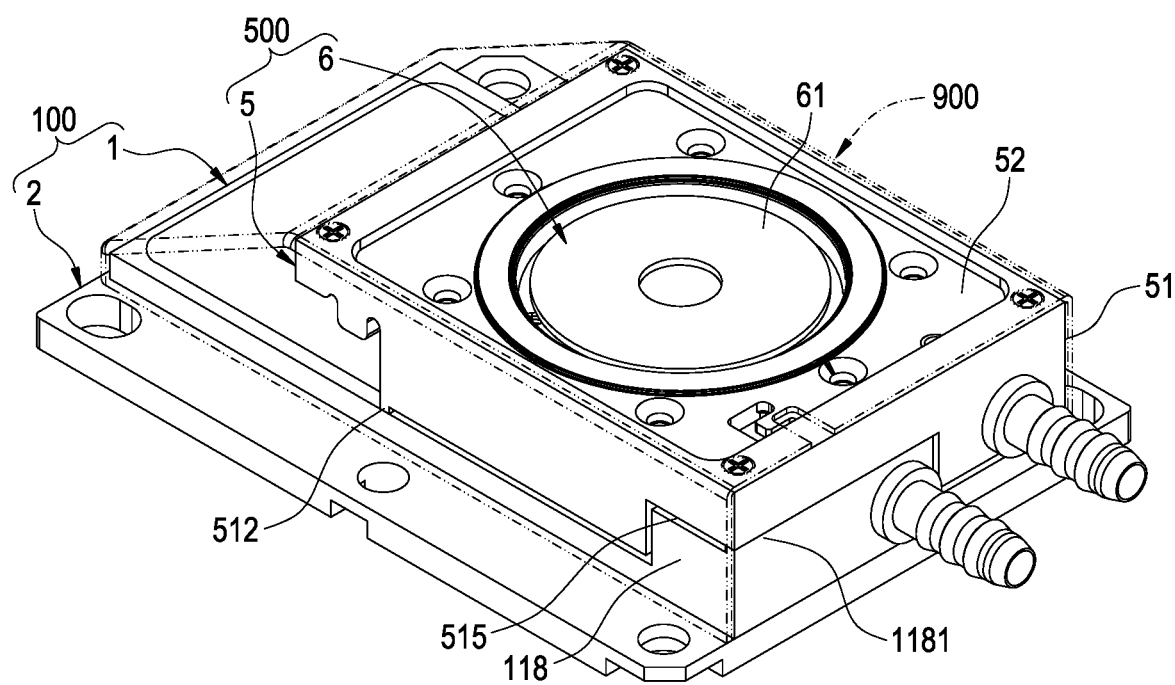
FIG. 8 is a perspective view of a fluid cooling device of this disclosure.

With reference to FIG. 8 for a fluid cooling device of this disclosure, the fluid cooling device mainly uses a fluid as a medium to carry out the heat of a heat source (not shown in the figure), and the heat is dissipated through a cooling rack (not shown in the figure), and the fluid used in this disclosure is not limited to any particular gas or liquid, and water is used in this embodiment for illustration.

Figure 7:
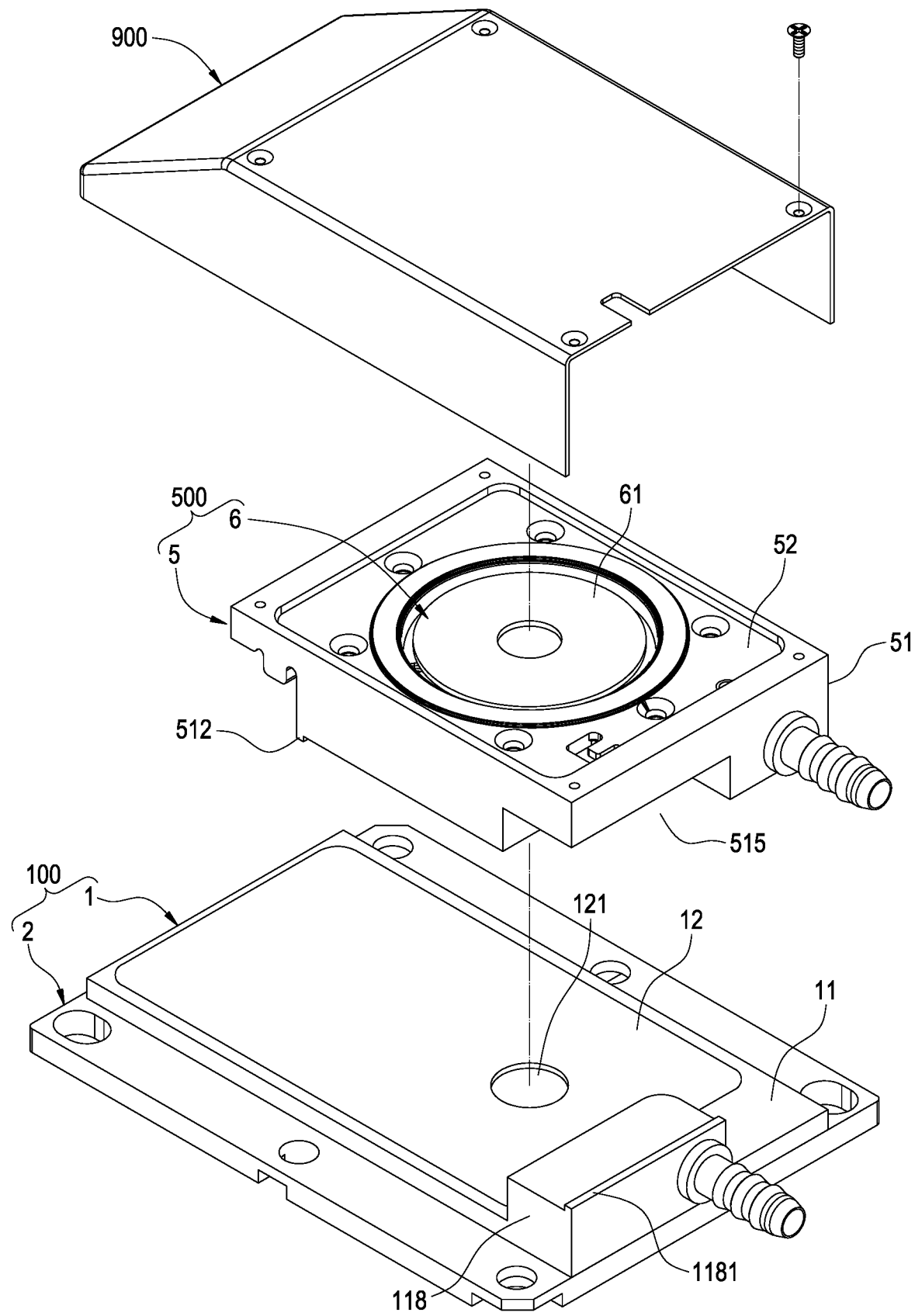
FIG. 7 is an exploded view of a fluid cooling device of this disclosure.

With reference to FIGS. 7 and 8, the fluid cooling device of this disclosure comprises a heat sink 100 and a fluid pump 500, and preferably further comprises an external cover 900.

With reference to FIGS. 1 to 3 and 7 to 10, the heat sink 100 comprises an endothermic cover 1 and an endothermic base 2 for absorbing the heat of a heat source (not shown in the figure). In general, the bottom of the heat sink 100 is attached to the heat source.

The endothermic cover 1 has a cover chamber C1 formed therein, and the endothermic cover 1 has a port 121 communicating with the cover chamber C1.

The endothermic base 2 includes a heat exchange chamber C2 and a heat exchange unit 22. The heat exchange chamber C2 is formed between the endothermic cover 1 and the endothermic base 2, and the heat exchange unit 22 is installed in the heat exchange chamber C2. Therefore, the heat sink 100 has two chambers (including the cover chamber C1 and the heat exchange chamber C2), and a fluid flows through a path to the heat exchange chamber C2 at the bottom first and then to the cover chamber C1 at the top, and finally flows upwardly from the port 121 to the outside.

The endothermic cover 1 and the endothermic base 2 are longitudinally attached to each other, and the port 121 is longitudinally formed on the endothermic cover 1.

With reference to FIGS. 4 to 6 and 7 to 10, the fluid pump 500 comprises a pump housing 5 and a driving element 6 and provided for absorbing the fluid looping and flowing in the heat sink 100, wherein the fluid acts as a medium to carry out the heat.

The pump housing 5 has a pump space S defined therein. The driving element 6 is installed in the pump housing 5, and the driving element 6 has a vane 621 received in the pump space S.

Figure 9:
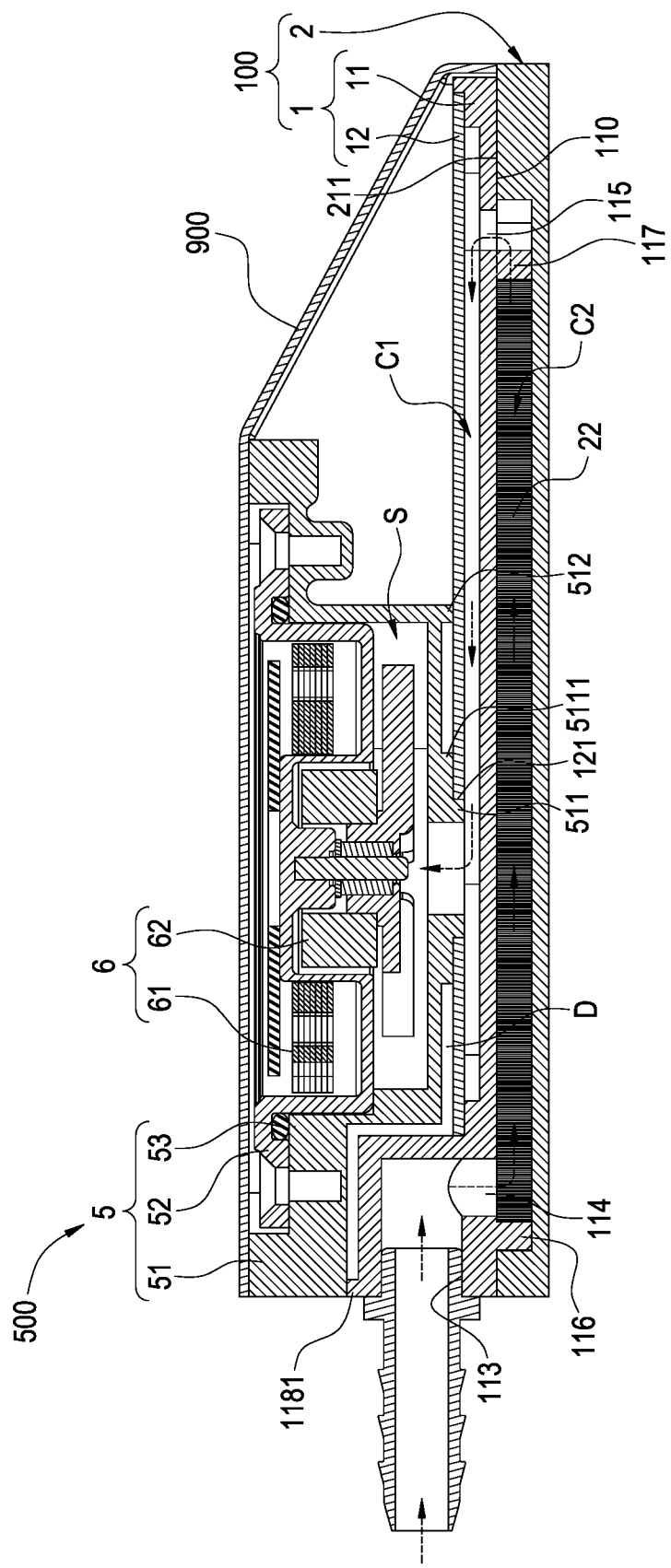
FIG. 9 is a longitudinal sectional view of a fluid inlet of a fluid cooling device of this disclosure.

The pump housing 5 further has a coupling tube 511 protruding outwardly, and the coupling tube 511 communicates with the pump space S, and the coupling tube 511 is preferably longitudinally protruded. In FIG. 9, the coupling tube 511 is longitudinally plugged into the port 121, and seamlessly combined and fixed with the outer periphery of the coupling tube 511 and the inner periphery of the port 121, so that the plugging position will have no seam at all and no waterproof gasket will be required. In the meantime, the pump housing 5 can maintain an insulation gap D (as shown in FIG. 9) through the inserted coupling tube 511 and the endothermic cover 1, and the insulation gap D is capable of isolating most of the heat of the heat sink 100, and thus most electronic components in the driving element 6 will not be affected by the heat.

Figure 5:
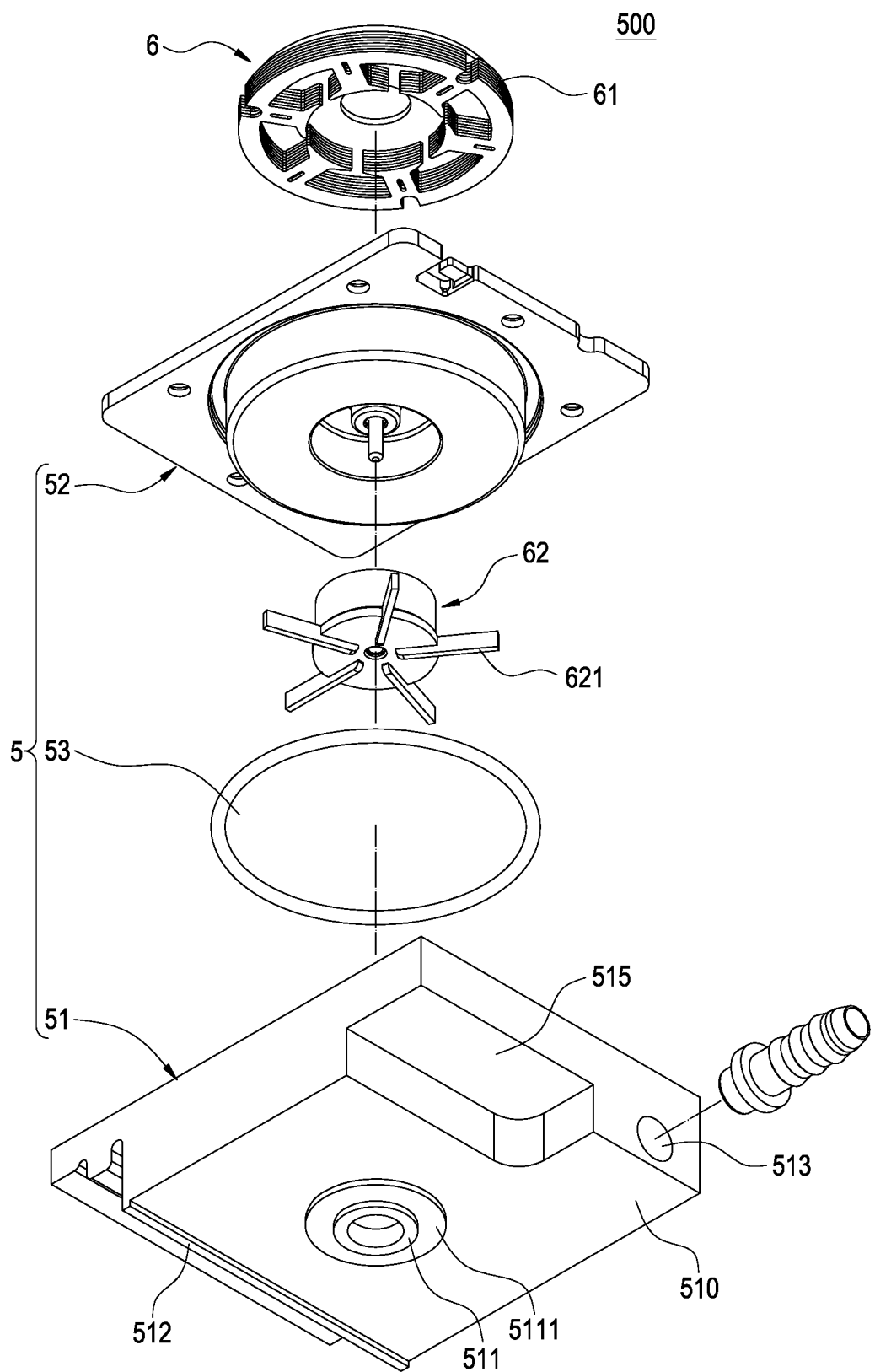
FIG. 5 is a bottom exploded view of a fluid pump in a fluid cooling device of this disclosure.
Figure 6:
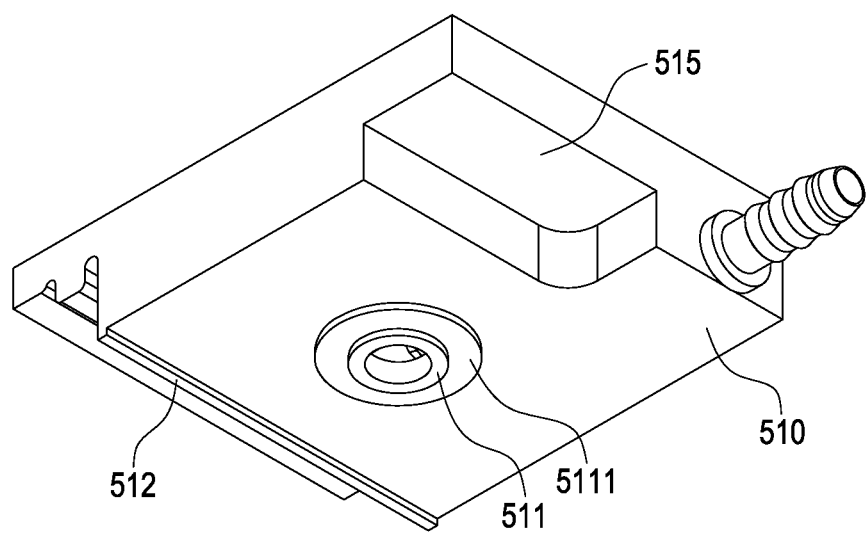
FIG. 6 is a perspective view of a fluid pump in a fluid cooling device of this disclosure.

An elevated portion 5111 (as shown in FIGS. 5 and 9) is formed at the outer periphery of the coupling tube 511, and the elevated portion 5111 is longitudinally protruded from the pump housing 5 to the outside, so that the elevated portion 5111 can be supported stably between the pump housing 5 and the endothermic cover 1 to ensure that the required insulation gap D can be produced between an adjacent bottom 510 of the pump housing 5 and an adjacent top 111 of the endothermic cover 1.

In a preferred embodiment, the pump housing 5 comprises a pump base 51, a pump cover 52 and an anti-leakage member 53. The pump cover 52 is longitudinally covered onto the pump base 52, and the anti-leakage member 53 is installed between the pump base 51 and the pump cover 52, and the pump space S is formed between the pump base 51 and the pump cover 52.

In the design of the flow path of the fluid pump 500, the coupling tube 511 (with an elevated portion 5111) is longitudinally protruded from the adjacent bottom 510 of the pump base 51, and the pump base 51 further has a fluid outlet 513 and a pump opening 514 transversally formed thereon and communicating with each other, and the pump opening 514 communicates with the coupling tube 511 through the pump space S. In other words, the coupling tube 511 and the fluid outlet 513 communicate with each other through the pump space S.

In a preferred embodiment, the driving element 6 comprises a stator 61 and a rotor 62, and the rotor 62 has the vane 621. The stator 61 (including a plurality of electronic components not shown in the figure) is installed on a side of the pump cover 52, and the rotor 62 is rotatably and pivotally coupled to the other side of the pump cover 52 with respect to the pump space S, so that the stator 61 and the rotor 62 are separated by the pump cover 52 and disposed opposite to each other (as shown in FIG. 9).

The seamless combination and fixation of this disclosure are not limited to any particular method, and it can be achieved by 3D printing, casting or welding. If the 3D printing or casing is adopted, the fluid pump 5, the endothermic cover 1 and the endothermic base 2 can be integrally formed at a time, so that the coupling tube 511 and the port 121 can be seamlessly combined and fixed with each other. In this embodiment, welding is used for illustration. To use the welding method, the endothermic cover 1 and the pump housing 5 must be made of metal.

In a preferred embodiment of this disclosure, the heat sink 100 is welded and fixed, so that the effects of producing no seams and requiring no waterproof gasket can be achieved.

In FIGS. 1 to 3 and 7 to 10, the endothermic base 2 of the heat sink 100 are also made of metal to facilitate attaching them with the metallic endothermic cover 1 longitudinally and welded and fixed with each other at the attaching position.

To facilitate the welding, the endothermic base 2 has a surrounding plate 21 surrounding the heat exchange chamber C2, and the surrounding plate 21 has an attaching top surface 211. A side of the heat exchange chamber C2 is formed by depressing a part of the area of the attaching top surface 211. Specifically, the side of the heat exchange chamber C2 is depressed on the attaching top surface 211 and in a direction away from the endothermic cover 1. The endothermic cover 1 has an attaching bottom surface 110 configured to be corresponsive to the heat exchange chamber C2 and covering the attaching top surface 211, so that the attaching bottom surface 110 of the endothermic cover 1 is attached to the attaching top surface 211 of the endothermic base 2 and the two surfaces 110, 211 are welded and fixed with each other at the attaching position.

In a preferred embodiment, the endothermic cover 1 further comprises a cover body 11 and a combining board 12 longitudinally combined with each other, and the cover chamber C1 is formed between the cover body 11 and the combining board 12, and the port 121 is formed on the combining board 12. The combining board 12 is attached to the cover body 11, and the combining board 12 and the cover body 11 are welded and fixed with each other at the attaching position. To facilitate the welding, the endothermic cover 1 has a structure as described below.

The cover body 11 has an adjacent top 111 and a surrounding stair 112. The surrounding stair 112 surrounds the cover chamber C1 and protrudes upwardly in the cover chamber C1. Specifically, the surrounding stair 112 is protruded out of the cover chamber C1 in a direction towards the combining board 12, so that the surrounding stair 112 has an attaching top surface 1121. The combining board 12 has an attaching bottom surface 120 configured to be corresponsive to the cover chamber C 1 and covered by the attaching top surface 1121, so that the attaching bottom surface 120 is attached to the attaching top surface 1121 of the cover body 11, and the two surfaces 120, 1121 are welded and fixed with each other at the attaching position. It must be stated that a side of the cover chamber C1 is formed by depressing the attaching top surface 1121 in a direction away from the combining board 12.

Therefore, the integral structure of this disclosure including the heat sink 100 and the fluid pump 500 can be welded and fixed into a single structure. In addition, the welding and fixing of this disclosure can provide the following effects: The manufacturing process no longer requires too many procedures, so that the manufacturing time and labor can be reduced. The connecting positions or combining positions required for the manufacture can be reduced, so as to lower the chance of having a fluid leakage. The fully metal welded structure can improve the anti-vaporization/transpiration rate effectively and reduce the connecting positions or combining positions for the assembling, so that the vaporization/transpiration can be reduced significantly.

In the design of the flow path of the heat sink 100, the endothermic cover 1 has a fluid inlet 113 transversally formed thereon, and the endothermic cover 1 further has a first cover opening 114 and a second cover opening 115 longitudinally formed thereon and disposed away from each other. The fluid inlet 113 communicates with the first cover opening 114, and the first cover opening 114 communicates with the second cover opening 115 through the heat exchange chamber C2 at the bottom, and the second cover opening 115 is formed upwardly from the cover chamber C1 at the top and communicates with the port 121.

Figure 10:
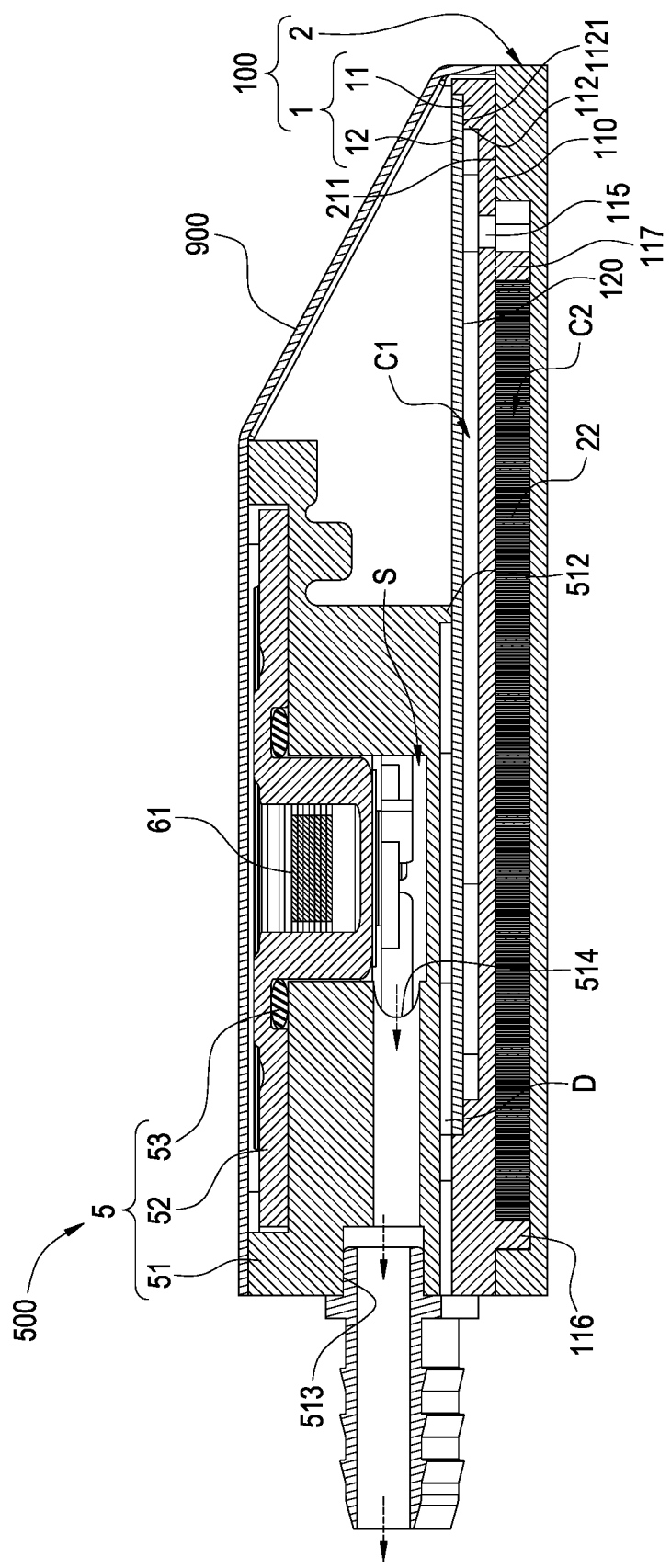
FIG. 10 is a longitudinal sectional view of a fluid outlet of a fluid cooling device of this disclosure.
Figure 11:
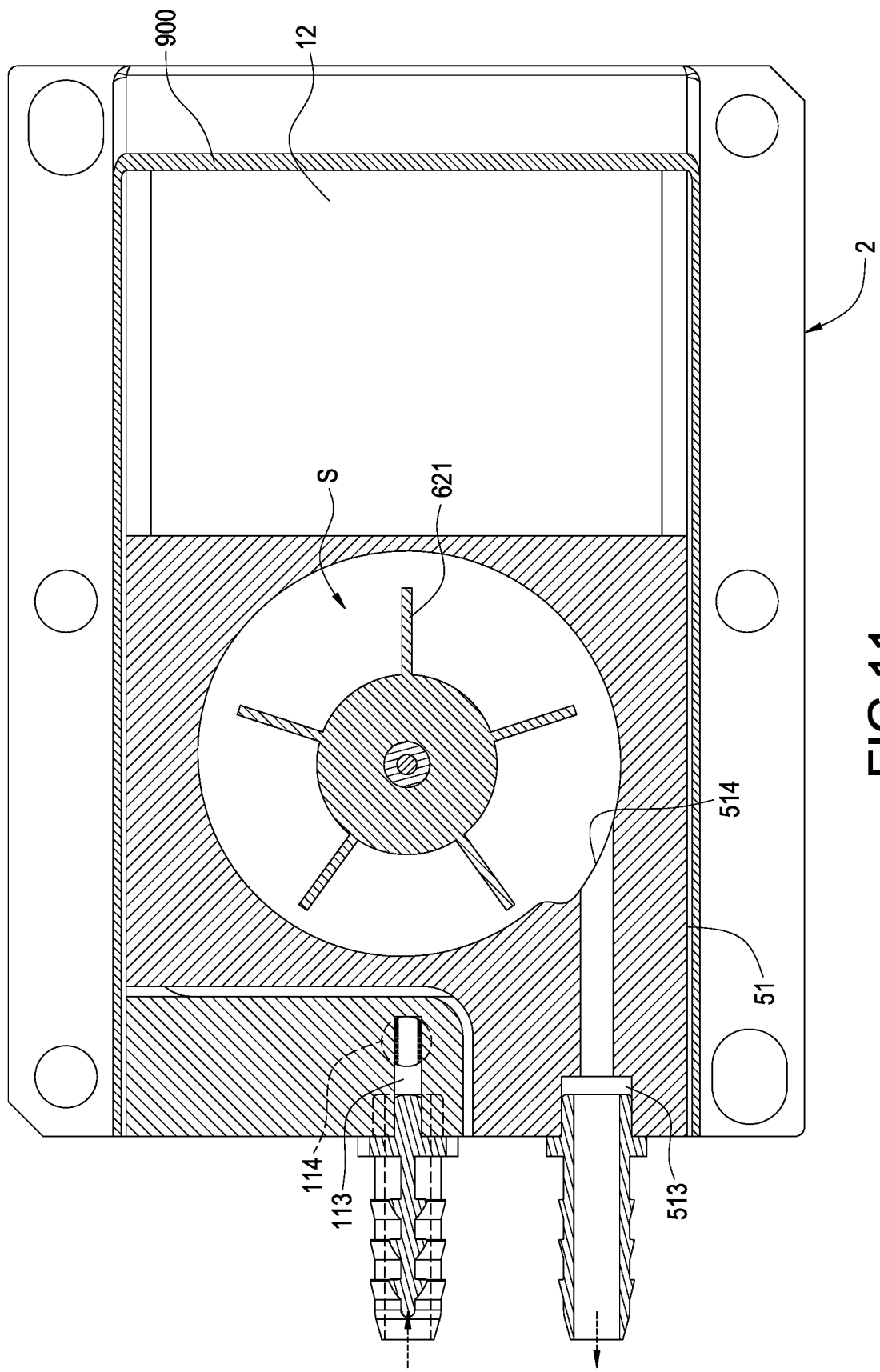
FIG. 11 is a cross-sectional view of a pump space of a fluid cooling device of this disclosure.
Figure 12:
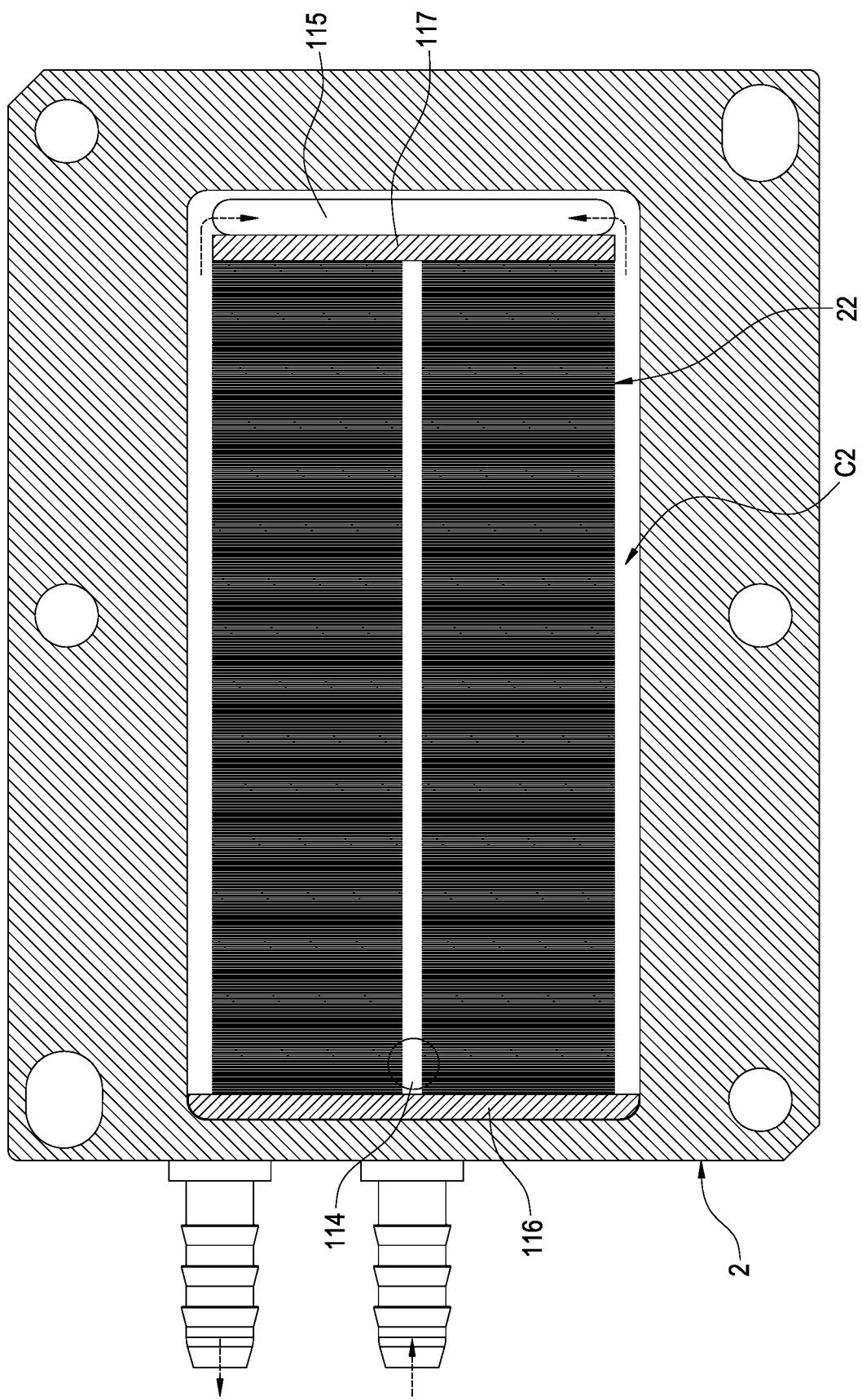
FIG. 12 is a cross-sectional view of a heat exchange chamber of a fluid cooling device of this disclosure.

In FIGS. 9 and 10, the attaching bottom surface 110 of the endothermic cover 1 and a bottom surface of the endothermic base 2 (the inner bottom surface of the heat exchange chamber C2, not labelled in the figure) are attached to two opposite sides of the heat exchange unit 22 respectively. In other words, the heat exchange unit 22 is longitudinally clamped between the endothermic cover 1 and the endothermic base 2 to facilitate heat conduction. In FIGS. 11 and 12, the heat exchange unit 22 of this embodiment comprises two heat exchange racks separated with an interval apart from each other, and each heat exchange rack comprises a plurality of fins; and the first cover opening 114 is staggered with respect to the heat exchange unit 22 to facilitate passing the fluid. In this embodiment, the first cover opening 114 is configured to be corresponsive to the interval between the two heat exchange racks.

Figure 1:
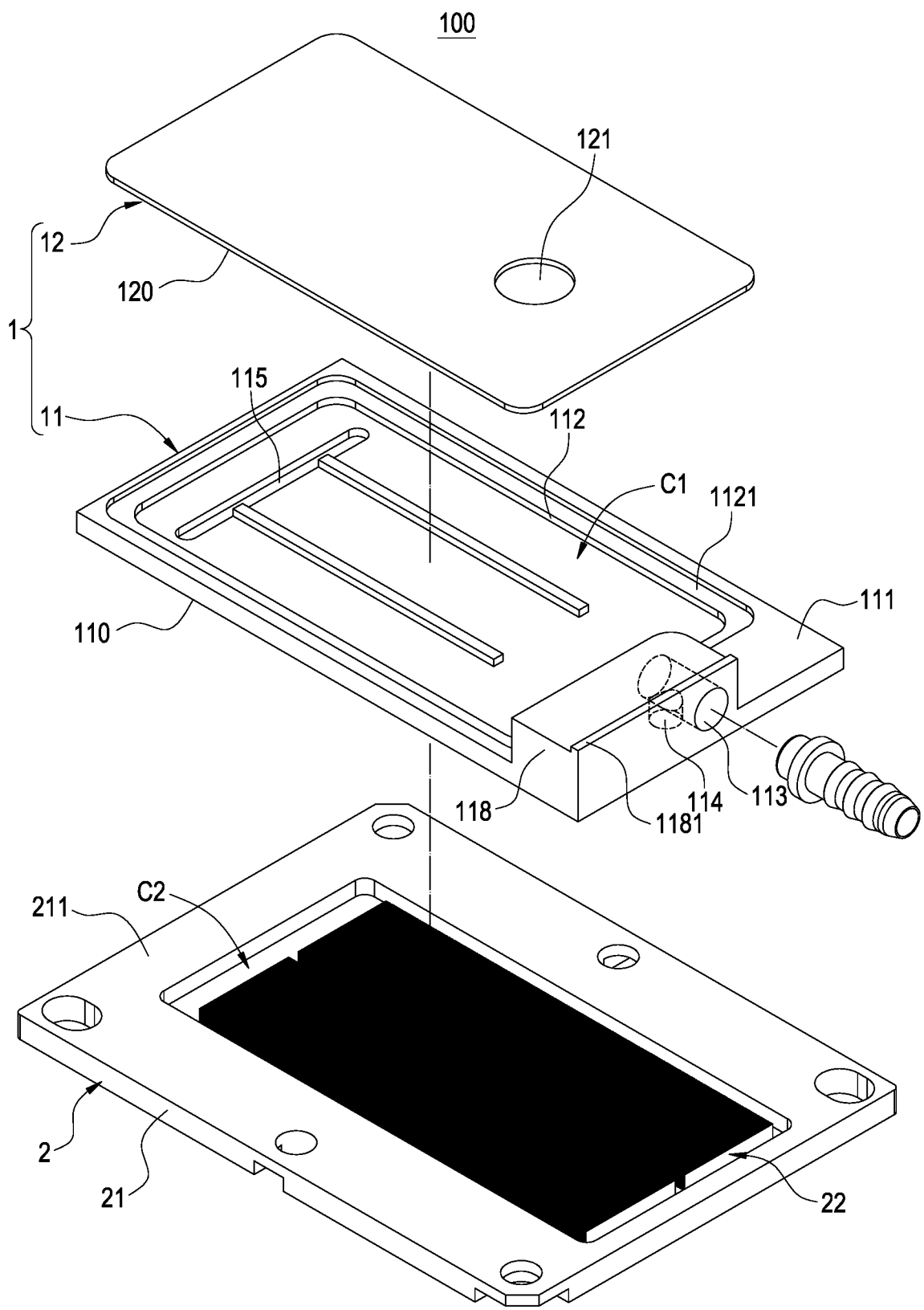
FIG. 1 is a top exploded view of a heat sink in a fluid cooling device of this disclosure.
Figure 2:
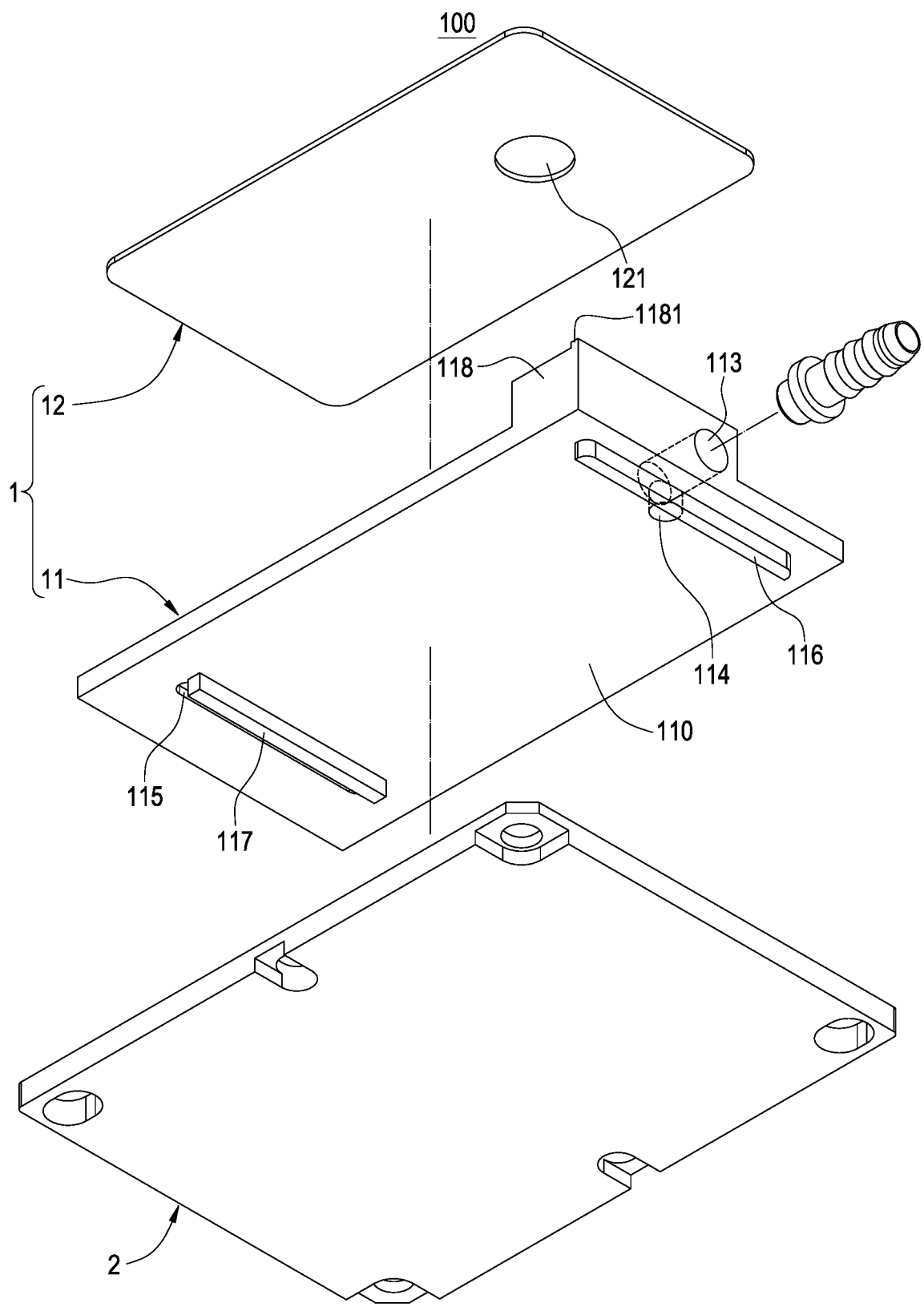
FIG. 2 is a bottom exploded view of a heat sink in a fluid cooling device of this disclosure.
Figure 3:
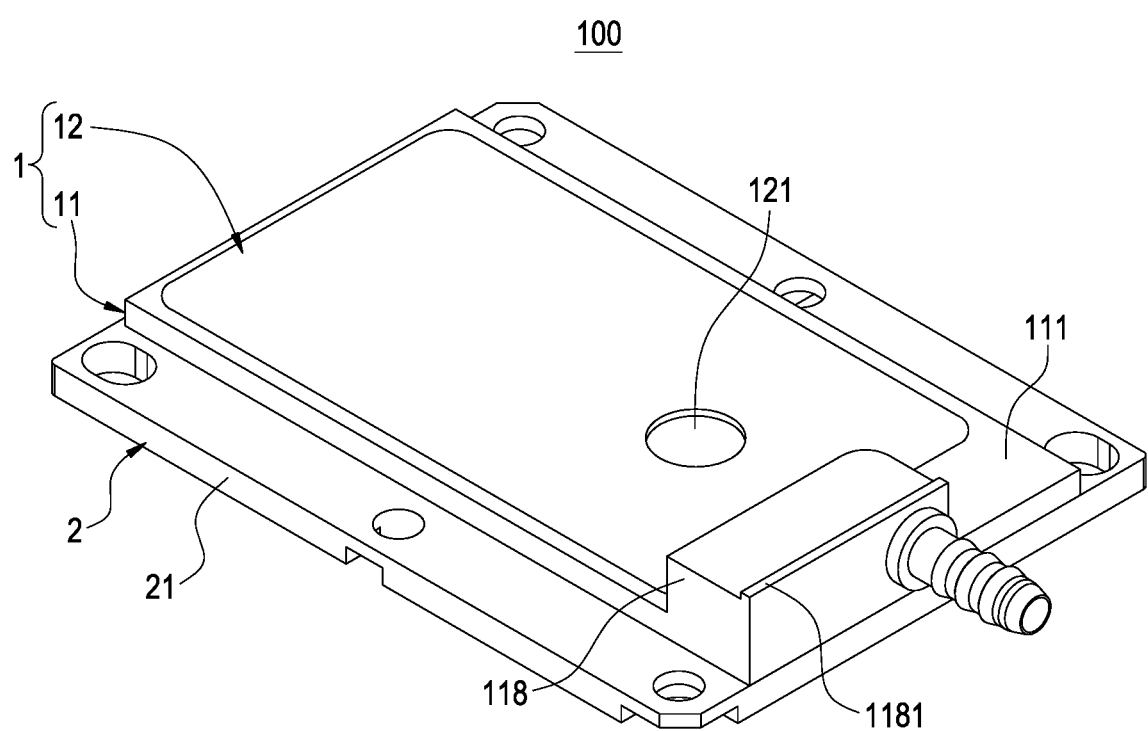
FIG. 3 is a perspective view of a heat sink in a fluid cooling device of this disclosure.
Figure 4:
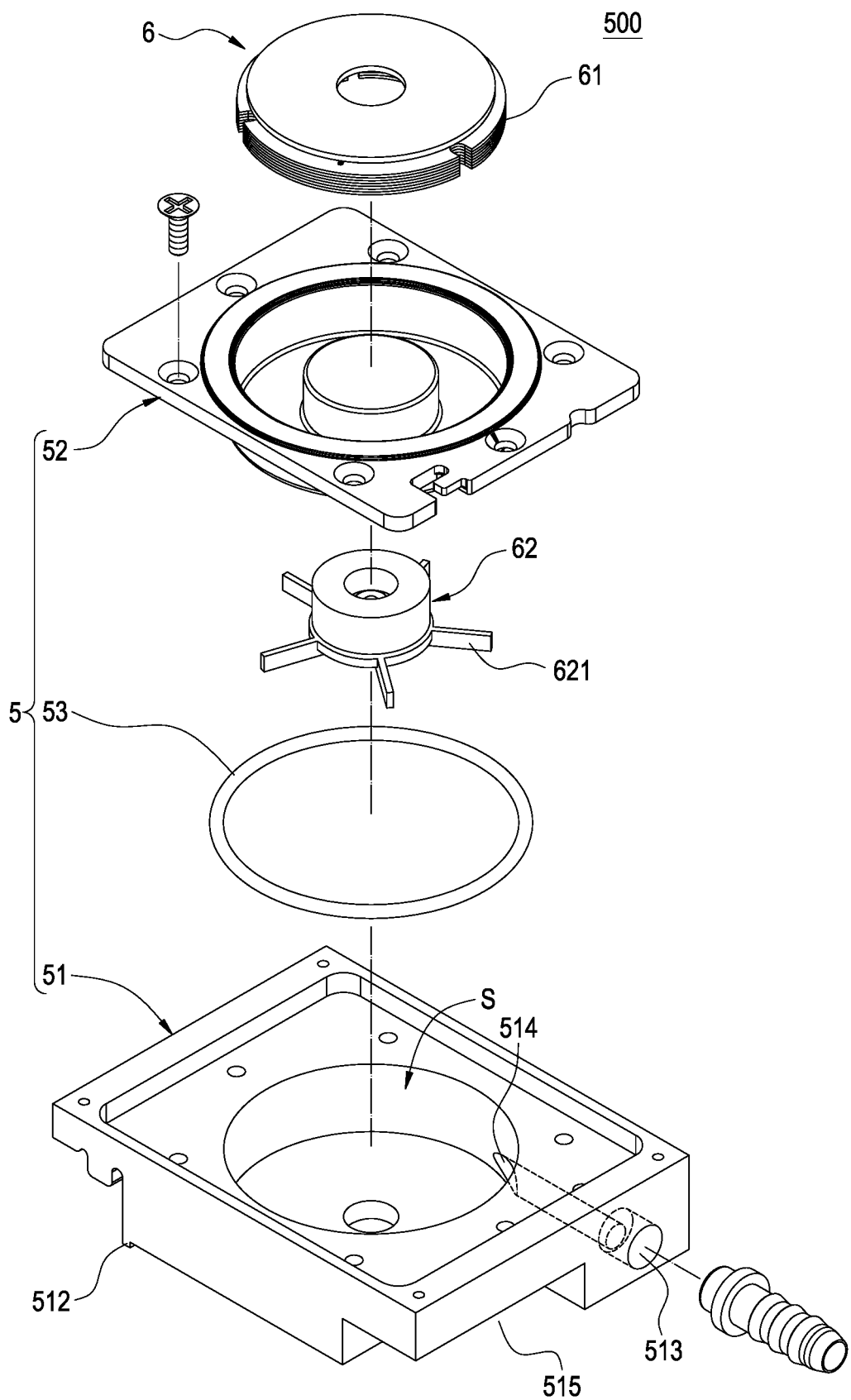
FIG. 4 is a top exploded view of a fluid pump in a fluid cooling device of this disclosure.

In FIGS. 1, 2 and 12, the attaching bottom surface 110 of the cover body 11 has two convex walls protruded longitudinally and configured to be opposite to each other, and the two convex walls include a first convex wall 116 and a second convex wall 117. These two convex walls are protruded into the heat exchange chamber C2 until the convex walls abut against the endothermic base 2. The heat exchange unit 22 is transversally clamped between the two convex walls, and the perforated first cover opening 114 is disposed between the two convex walls and near the first convex wall 116, and the long-strip shaped second cover opening 115 is disposed outside the two convex walls and attached to the second convex wall 117, and the first convex wall 116 is attached to an inner periphery of the heat exchange chamber C2, and both of the length of the second convex wall 117 and the length of the second cover opening 115 correspond to the width of the heat exchange unit 22. Therefore, the fluid is outputted from the first upper opening 114, and then the fluid flows along the multi-flow path and through each fin to perform heat exchange. Finally, the fluid is collected at the second upper opening 115 and flows upwardly into the cover chamber C1.

In FIGS. 3, 6 and 7 to 9, a first rib 1181 protrudes longitudinally from the adjacent top 111 of the endothermic cover 1, and a second rib 512 protrudes longitudinally from the adjacent bottom 510 of the pump housing 5, and the first rib 1181 and the second rib 512 are configured to be corresponsive to the coupling tube 511 to achieve a balanced, stable, and unbiased effect when the fluid pump 500 is inserted into the port 121 of the heat sink 100 by the coupling tube 51. In this embodiment, the first rib 1181 and the second rib 512 are disposed at two relative positions of the coupling tube 511 respectively, so that the first rib 1181 and the second rib 512 are supported between the adjacent bottom 510 and the adjacent top 111 to ensure that the combined fluid pump 500 and heat sink 100 will not be biased with each other. In addition, the endothermic cover 1 of the heat sink 100 and the pump housing 5 of the fluid pump 500 have a protrusion 118 and a recession 515 respectively, and the protrusion 118 and the recession 515 are combined with an interval apart from each other, so that the fluid pump 500 combined with the heat sink 100 has a positioning effect. Wherein, the protrusion 118 protrudes upwardly from the adjacent top 111, and the first rib 1181 protrudes upwardly from the top surface of the protrusion 118. In addition, the external cover 900 is longitudinally covered and fixed onto the fluid pump 500.

Both of the heat sink 100 and the fluid pump 500 are cuboids to facilitate the assembling and welding processes.

In summation of the description above, the fluid cooling device of this disclosure surely achieve the expected using objectives and overcome the drawbacks of the prior art, and this disclosure complies with patent application requirements, and thus is duly filed for patent application.

While this disclosure has been described by means of specific embodiments, numerous modifications and variations could be made thereto by those skilled in the art without departing from the scope and spirit of this disclosure set forth in the claims.

It will be apparent to those skilled in the art that this disclosure is not limited to the details of the aforementioned exemplary embodiments, but this disclosure can be implemented in other specific forms without departing from the spirit or essential features of this disclosure. The present embodiments are to be considered as illustrative rather than restrictive, and the scope of this disclosure is defined by the appended claims rather than and intended to cover the interpretation and scope of equivalent conditions and all changes within the scope of the claims of this disclosure. Any numerals in the drawings of the claims should not be construed as limiting the scope of the claims.

In the description of this disclosure, it should be understood that the terms "center", "longitudinally", "transversally", "top", "bottom", "front", "rear", "left", "right", "vertical", "horizontal", "top surface", "bottom surface", "inside", "outside", etc. refer to an indicated orientation and a positional relation based on the orientation and positional relation as shown in the attached drawings. These terms are used for the purpose of describing the creation of this disclosure and simplifying the description, but not intended for indicating or implying that the device or component must have the specific position, the specific positional structure and operation, so that these terms should not be construed as a limitation on this disclosure. In addition, the terms "first", and "second" are used for simplifying the description only, but should not be understood as indicating or implying the relative importance or the quantity of the technical characteristics as implied or indicated. Therefore, the characteristic limiting the "first" and the "second" may indicate or imply one or more characteristics. In the description of this disclosure, the meaning of "a plurality of" refers to a quantity of two or more, unless specific otherwise.

In addition, it should be understood that although this disclosure is described in terms of embodiments, not every embodiment just includes one independent technical solution only. The description of the specification is merely for the sake of clarity, and those skilled in the art should consider the specification as a whole, and the technical solutions of each embodiment may be combined appropriate to form other embodiments that can be understood by those skilled in the art.

What is claimed is:

1. A fluid cooling device, comprising:
   an endothermic cover, having a port formed thereon;
   an endothermic base, having a heat exchange chamber and a heat exchange unit installed in the heat exchange chamber, and the heat exchange chamber being defined between the endothermic cover and the endothermic base, and the endothermic base and the endothermic cover being longitudinally attached to each other, and the port being longitudinally formed on the endothermic cover; and
   a fluid pump, including a pump housing and a driving element installed in the pump housing, and the pump housing having a pump space defined therein, and the driving element having a vane received in the pump space, and the pump housing having a coupling tube protruding towards the outside and communicating with the pump space, and the coupling tube being longitudinally plugged into the port and seamlessly combined and fixed to the coupling tube, and the pump housing maintaining an insulation gap with the endothermic cover through the coupling tube,
   wherein the endothermic cover and the endothermic base are combined with each other to form a heat sink, and both of the heat sink and the fluid pump are cuboids and have a protrusion and a recession, and the protrusion is combined with the recession with an interval apart from each other.

2. The fluid cooling device according to claim 1, wherein the coupling tube has an elevated portion formed at an outer periphery thereof, and the elevated portion longitudinally protruding from the pump housing to the outside, and supported between the pump housing and the endothermic cover to produce the insulation gap.

3. The fluid cooling device according to claim 1, wherein the pump housing comprises a pump base and a pump cover longitudinally covering onto the pump base, and the pump space is formed between the pump cover and the pump base, and an anti-leakage ring is installed between the pump cover and the pump base; and the pump base has the coupling tube protruded longitudinally, and a fluid outlet and a pump opening transversally formed on the pump base and communicating with each other, and the pump opening communicates with the coupling tube through the pump space; and the driving element comprises a stator and a rotor having the vane, and the stator is installed to a side of the pump cover, and the rotor is installed to the other side of the pump cover and configured to be corresponsive to the pump space, and the stator and the rotor are separated by the pump cover and disposed opposite to each other.

4. The fluid cooling device according to claim 1, wherein the fluid pump, the endothermic cover and the endothermic base selectively adopt at least one of the 3D printing and casting, so that the coupling tube is seamlessly combined and fixed to the port.

5. The fluid cooling device according to claim 1, wherein the coupling tube and the port are seamlessly combined, fixed and welded with each other, and the endothermic cover and the pump housing are made of metal.

6. The fluid cooling device according to claim 5, wherein the endothermic base is made of metal and longitudinally affixed and welded to the endothermic cover at an attaching position; and the endothermic base has a surrounding plate surrounding the heat exchange chamber, and the surrounding plate has an attaching top surface, and a side of the heat exchange chamber is depressed on the attaching top surface and in a direction away from the endothermic cover, and the endothermic cover is configured to be corresponsive to the heat exchange chamber and an attaching bottom surface covered by the attaching top surface, and the attaching bottom surface is affixed onto the attaching top surface and welded and fixed with the attaching top surface; the endothermic cover comprises a cover body and a combining board longitudinally combined with each other, and the port is formed at the combining board, and the combining board is attached to the cover body and welded and fixed at an attaching position.

7. The fluid cooling device according to claim 6, wherein the endothermic cover has a cover chamber formed therein, and the port communicates with the cover chamber.

8. The fluid cooling device according to claim 7, wherein the cover body has a surrounding stair surrounding the cover chamber and protruding into the cover chamber and in a direction near the combining board, and the surrounding stair has an attaching top surface, and the combining board has an attaching bottom surface configured to be corresponsive to the cover chamber and covered by the attaching top surface, and the attaching bottom surface is attached to the attaching top surface and seamlessly combined and fixed to the attaching top surface.

9. A fluid cooling device, comprising:
   an endothermic cover, having a port formed thereon;
   an endothermic base, having a heat exchange chamber and a heat exchange unit installed in the heat exchange chamber, and the heat exchange chamber being defined between the endothermic cover and the endothermic base, and the endothermic base and the endothermic cover being longitudinally attached to each other, and the port being longitudinally formed on the endothermic cover; and
   a fluid pump, including a pump housing and a driving element installed in the pump housing, and the pump housing having a pump space defined therein, and the driving element having a vane received in the pump space, and the pump housing having a coupling tube protruding towards the outside and communicating with the pump space, and the coupling tube being longitudinally plugged into the port and seamlessly combined and fixed to the coupling tube, and the pump housing maintaining an insulation gap with the endothermic cover through the coupling tube,
   wherein the endothermic cover has a fluid inlet transversally formed thereon and a first cover opening and a second cover opening longitudinally formed thereon and disposed away from each other, and the fluid inlet communicates with the first cover opening, and the first cover opening communicates with the second cover opening through the heat exchange chamber, and the second cover opening communicates with the port; and the endothermic cover and the endothermic base are respectively and longitudinally attached to two opposite sides of the heat exchange unit, and the first cover opening is staggered with respect to the heat exchange unit to facilitate passing a fluid; the endothermic cover attached to a side of the endothermic base has two convex walls longitudinally protruded and disposed opposite to each other, and the two convex walls protrude into the heat exchange chamber and abut against the endothermic base, and the heat exchange unit is transversally clamped between the two convex walls, and the two convex walls include a first convex wall and a second convex wall, and a perforated first cover opening is disposed between the two convex walls and near the first convex wall, and a long-strip shaped second cover opening is disposed outside the two convex walls and coupled to the second convex wall, and the first convex wall is attached to an inner periphery of the heat exchange chamber, and the second convex wall has the second cover opening with a length corresponding to the width of the heat exchange unit.

10. A fluid cooling device, comprising:

an endothermic cover, having a port formed thereon;

an endothermic base, having a heat exchange chamber and a heat exchange unit installed in the heat exchange chamber, and the heat exchange chamber being defined between the endothermic cover and the endothermic base, and the endothermic base and the endothermic cover being longitudinally attached to each other, and the port being longitudinally formed on the endothermic cover; and a fluid pump, including a pump housing and a driving element installed in the pump housing, and the pump housing having a pump space defined therein, and the driving element having a vane received in the pump space, and the pump housing having a coupling tube protruding towards the outside and communicating with the pump space, and the coupling tube being longitudinally plugged into the port and seamlessly combined and fixed to the coupling tube, and the pump housing maintaining an insulation gap with the endothermic cover through the coupling tube, wherein two ribs are disposed between the longitudinally separated pump housing and endothermic cover and configured to be corresponsive to the coupling tube, and supported between a side of the pump housing and a side of the endothermic cover.

* * * * *